United States Patent
Lee

(10) Patent No.: US 7,381,652 B2
(45) Date of Patent: Jun. 3, 2008

(54) METHOD OF MANUFACTURING FLASH MEMORY DEVICE

(75) Inventor: Sung Hoon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 58 days.

(21) Appl. No.: 11/605,128

(22) Filed: Nov. 28, 2006

(65) Prior Publication Data

US 2007/0275559 A1    Nov. 29, 2007

(30) Foreign Application Priority Data

May 26, 2006    (KR)  ................. 10-2006-0047689

(51) Int. Cl.
*H01L 21/302*    (2006.01)

(52) U.S. Cl. .............. 438/717; 438/700; 438/702

(58) Field of Classification Search ............. 438/700, 438/702, 706, 710, 712, 717, 723, 724, 725
See application file for complete search history.

(56) References Cited

U.S. PATENT DOCUMENTS

| | | | | |
|---|---|---|---|---|
| 5,578,854 | A * | 11/1996 | Chen et al. ............. | 257/349 |
| 6,031,287 | A * | 2/2000 | Harshfield ............. | 257/734 |
| 6,184,157 | B1 * | 2/2001 | Hsu et al. ............. | 438/784 |
| 6,303,955 | B1 * | 10/2001 | Lien et al. ............. | 257/296 |
| 2001/0021490 | A1 * | 9/2001 | Lee et al. ............. | 430/396 |
| 2004/0058535 | A1 * | 3/2004 | Matsutani et al. ....... | 438/689 |
| 2004/0161918 | A1 * | 8/2004 | Yun ...................... | 438/618 |
| 2005/0026049 | A1 * | 2/2005 | Ziebold et al. ......... | 430/5 |
| 2005/0040447 | A1 * | 2/2005 | Fukuzumi ............... | 257/295 |

FOREIGN PATENT DOCUMENTS

| | | |
|---|---|---|
| KR | 10-2002-0016338 A | 3/2002 |
| KR | 10-2003-0002828 A | 1/2003 |
| KR | 10-2006-0019149 A | 3/2006 |

* cited by examiner

*Primary Examiner*—Kin-Chan Chen
(74) *Attorney, Agent, or Firm*—Marshall, Gerstein & Borun LLP

(57) ABSTRACT

A method of manufacturing a flash memory device which an etch-prevention layer, first and second interlayer insulating layers, and first, second and third hard mask layers are sequentially formed on a semiconductor substrate. The third hard mask layer is etched to expose a portion of a region on the second hard mask layer. A photoresist pattern of a line shape is formed on the entire surface such that the photoresist pattern is exposed to be narrower than the region through which the second hard mask layer is exposed. The second hard mask layer is etched using the photoresist pattern as a mask. The first hard mask layer is etched using the photoresist pattern as a mask, and the second and first interlayer insulating layers are then etched using the remaining third and second hard mask layers as masks, thus forming a drain contact hole having a square shape. The etch-prevention layer is etched using the remaining second and first hard mask layers as masks, thereby exposing a predetermined region of the semiconductor substrate and opening the drain contact hole. It is thus possible to improve a bridge occurring between the contacts.

5 Claims, 5 Drawing Sheets

METHOD OF MANUFACTURING FLASH MEMORY DEVICE

BACKGROUND

1. Field of the Invention

The invention relates, in general, to flash memory devices and, more particularly, to a method of manufacturing a flash memory device, in which a contact hole of a square shape is formed through a dual mask process of a line fashion employing a hard mask layer, thus improving a bridge occurring between contacts.

2. Discussion of Related Art

In the formation method of the drain contact hole of a flash memory device, if an exposure process using ArF having a low wavelength as a light source in order to form micro patterns of 70 nm or less is performed using a photoresist (PR), Contact Edge Roughness (CER) of the patterns is degraded. Accordingly, spacer margin between patterns is reduced when the micro patterns are formed, causing a bridge between the patterns.

More particularly, since the space width between the contact holes on the layout is small, the etch selectivity is lowered when the drain contact hole is formed. Areas between the contacts are attached and thus collapse, thereby generating a bridge between the contacts.

During the process of forming an elliptical drain contact hole, if the size of the contact hole is set small in order to secure a space width between the contact holes due to the characteristic of the exposure process, the size of the contact hole in a long-axis direction is increased to reduce bridge margin between a drain select line (DSL) and a drain select line (DSL). It reduces the size of the contact hole and thus makes it difficult to secure the bridge margin between the contacts.

The occurrence of the bridge between the drain contacts results in global column FAILURE. Accordingly, the loss of the yield, which is incurred by one drain contact bridge, is very high.

SUMMARY OF THE INVENTION

Accordingly, the invention addresses the above problems, and provides a method of manufacturing a flash memory device, in which a contact hole of a square form is formed through a dual mask process of a line fashion employing a hard mask layer, improving the bridge occurring between the contacts.

According to one aspect, the invention provides a method of manufacturing a flash memory device, including the steps of sequentially forming an etch-prevention layer, first and second interlayer insulating layers, and first, second and third hard mask layers on a semiconductor substrate, etching the third hard mask layer to expose a portion of a region on the second hard mask layer, forming a photoresist pattern of a line shape on the entire surface such that the photoresist pattern is exposed to be narrower than the region through which the second hard mask layer is exposed, and then etching the second hard mask layer using the photoresist pattern as a mask, etching the first hard mask layer using the photoresist pattern as a mask, and then etching the second and first interlayer insulating layers using the remaining third and second hard mask layers as masks, thus forming a drain contact hole having a square shape, and etching the etch-prevention layer using the remaining second and first hard mask layers as masks, thus exposing a predetermined region of the semiconductor substrate and opening the drain contact hole.

DETAILED DESCRIPTION OF EMBODIMENTS

Specific embodiments according to the invention will be described with reference to the accompanying drawings.

Figure 1A:
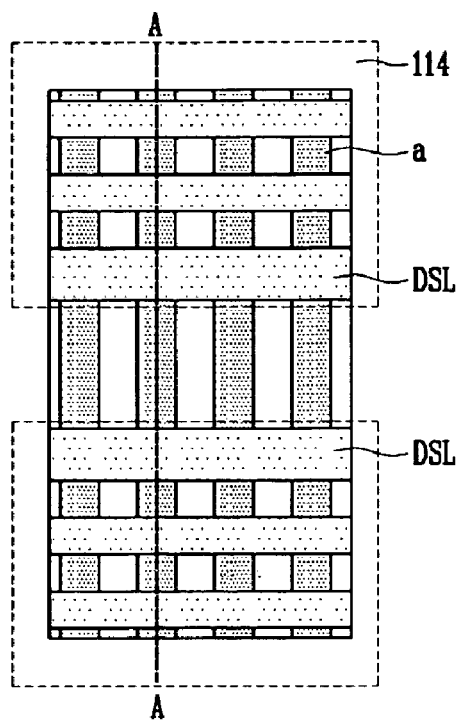
FIGS. 1A and 1B are layout diagrams sequentially illustrating a method of manufacturing a flash memory device according to an embodiment of the invention.
Figure 2A:
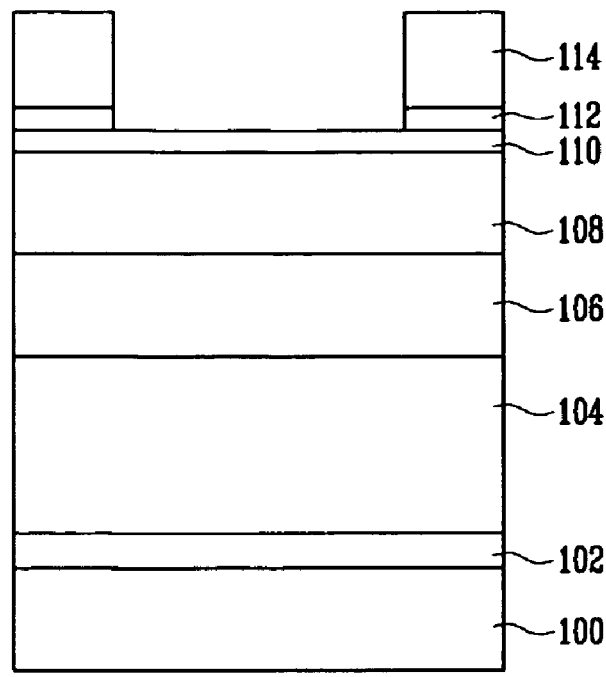
FIGS. 2A to 2F are cross-sectional views sequentially illustrating a method of manufacturing a flash memory device according to an embodiment of the invention.

Referring to FIGS. 1A and 2A, an etch-prevention layer 102 and a first interlayer insulating layer 104 are sequentially formed on a semiconductor substrate 100 in which predetermined structures such as an isolation layer, agate, a spacer, a self-aligned contact (SAC) nitride layer, etc. are formed. Chemical mechanical polishing (CMP) is then performed. The etch-prevention layer 102 may be formed using a nitride layer, and the first interlayer insulating layer 104 may be formed using a high-density plasma (HDP) oxide layer. The first interlayer insulating layer 104 and the etch-prevention layer 102 are etched by photo and etch processes, forming a source contact hole (not shown).

A first polysilicon layer is deposited on the entire surface so that the source contact hole is gap filled. The first polysilicon layer is polished so that the first interlayer insulating layer 104 is exposed, thereby forming a source contact plug. A second interlayer insulating layer 106 is formed on the entire surface. The second interlayer insulating layer 106 may be formed using a HDP oxide layer or plasma-end and tetraethyl with silicate (PE-TEOS).

A first hard mask layer 108, a second hard mask layer 110 and a third hard mask layer 112 are sequentially formed on the second interlayer insulating layer 106. The second hard mask layer 110 may be formed to a thickness of 200 Å to 800 Å and the third hard mask layer 112 may be formed to a thickness of 300 Å to 1000 Å.

In the case where the first hard mask layer 108 is formed using silicon nitride series, the second hard mask layer 110 is formed using silicon oxide series and the third hard mask layer 112 is formed using polysilicon series or silicon nitride series. In the case where the first hard mask layer 108 is formed using ashable hard mask series, the second hard mask layer 110 is formed using SiOxNy series and the third hard mask layer 112 is formed using polysilicon series.

A photoresist layer is formed on the entire surface. Exposure and development processes are then performed to form first photoresist patterns 114 so that a portion of a top surface of the third hard mask layer 112 is exposed. Regions through which a portion of the top surface of the third hard mask layer 112 is exposed when the first photoresist patterns 114 are formed may be decided in consideration of the space between drain select lines (DSL) and overlay margin of an exposure apparatus.

The third hard mask layer 112 is etched using the first photoresist patterns 114 as a mask. During the etch process of the third hard mask layer 112, the second hard mask layer 110 is used as an etch-prevention layer.

Figure 1B:
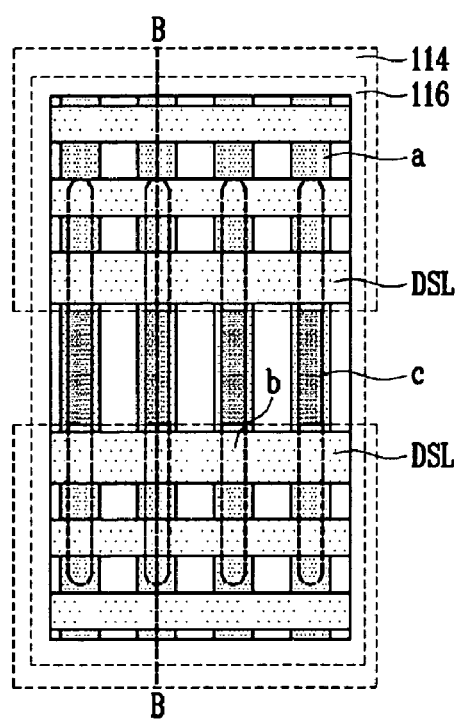
Figure 2B:
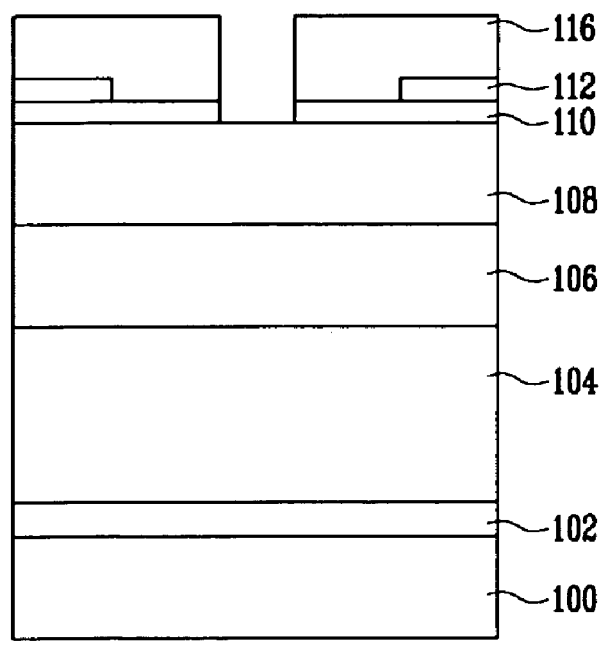

Referring to FIGS. 1B and 2B, in a state where the first photoresist patterns 114 are formed, a photoresist layer is formed on the entire surface. Exposure and development processes are then implemented to form second photoresist patterns 116 of a line fashion so that a portion of a top surface of the second hard mask layer 110 is exposed.

The second photoresist patterns 116 are formed on active regions (a) in which the drain contact is formed in line form. A long-axis length of the second photoresist pattern 116 is longer than a space width between the drain select lines (DSL). Accordingly, a portion in which the drain contact hole is formed has a straight-line shape (b) and the drain contact hole of a square shape (c) can be formed.

The second hard mask layer 110 is etched using the second photoresist patterns 116 as a mask.

Figure 2C:
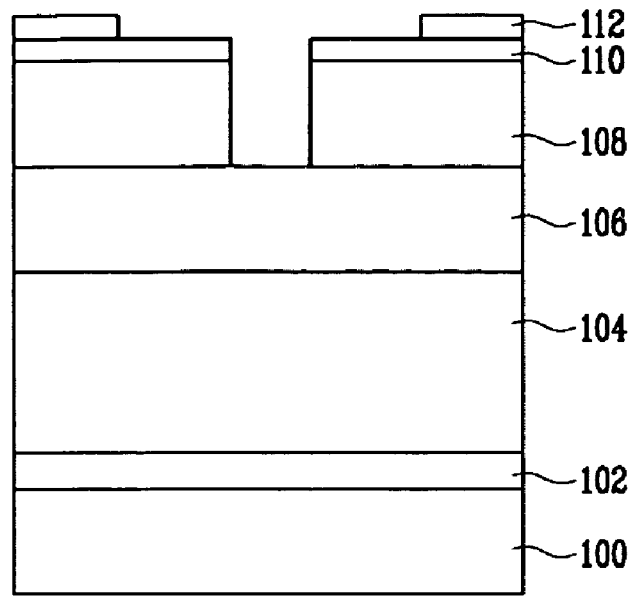

Referring to FIG. 2C, after the first hard mask layer 108 is etched using the second photoresist patterns 116 as a mask, the second photoresist patterns 116 are stripped.

Figure 2D:
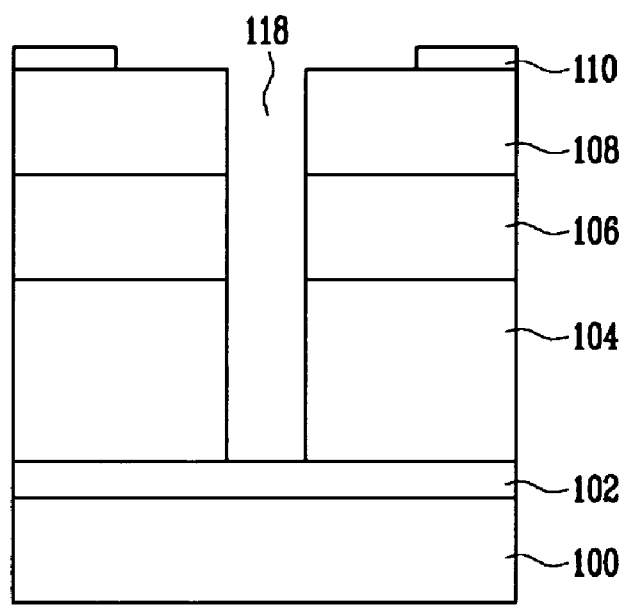

Referring to FIG. 2D, the second and first interlayer insulating layers 106 and 104 are etched using the third and second hard mask layers 112 and 110 as masks, forming a drain contact hole 118. In this case, at the time of the etch process of the second and first interlayer insulating layers 106 and 104, etching is stopped on the etch-prevention layer 102. The second hard mask layer 110 exposed by the third hard mask layer 112 and the third hard mask layer 112 is stripped.

Figure 2E:
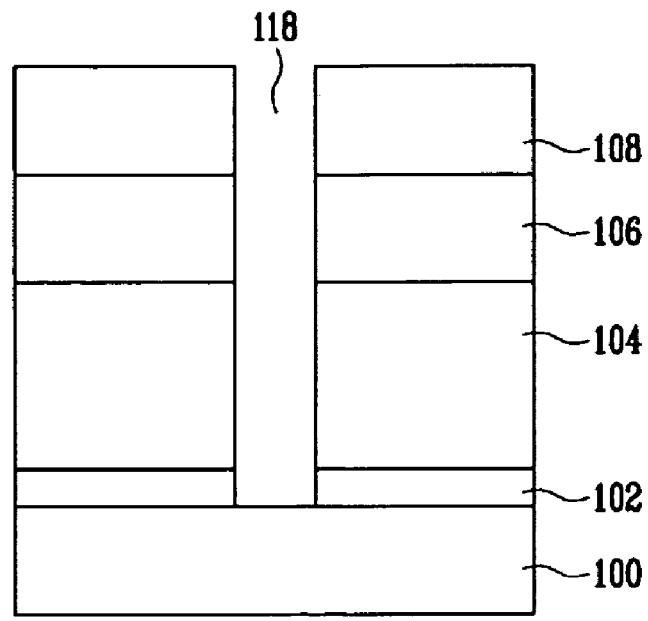

Referring to FIG. 2E, the etch-prevention layer 102 is etched using the remaining second hard mask layer 110 and the remaining first hard mask layer 108 as a mask. Accordingly, a predetermined region of the semiconductor substrate 100 is exposed to open the drain contact hole 118. During the strip process of the etch-prevention layer 102, the second hard mask layer 110 is stripped.

Figure 2F:
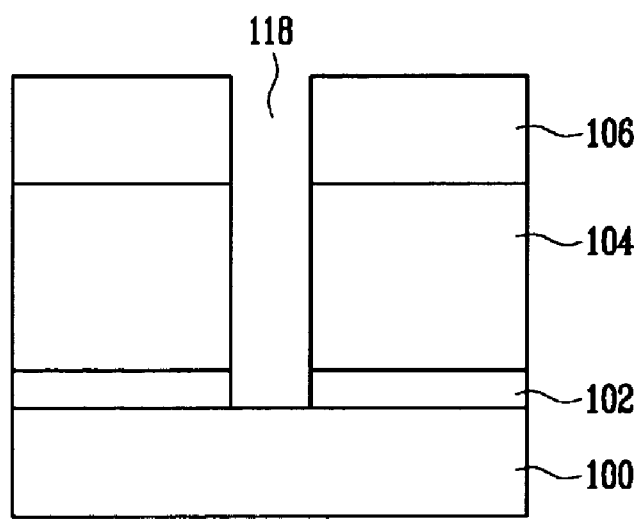

Referring to FIG. 2F, the first hard mask layer 108 is stripped.

Though not shown in the, drawings, a polysilicon layer is deposited on the entire surface so that the drain contact hole 118 is gap filled. The polysilicon layer is polished to form a drain contact plug.

Figure 3:
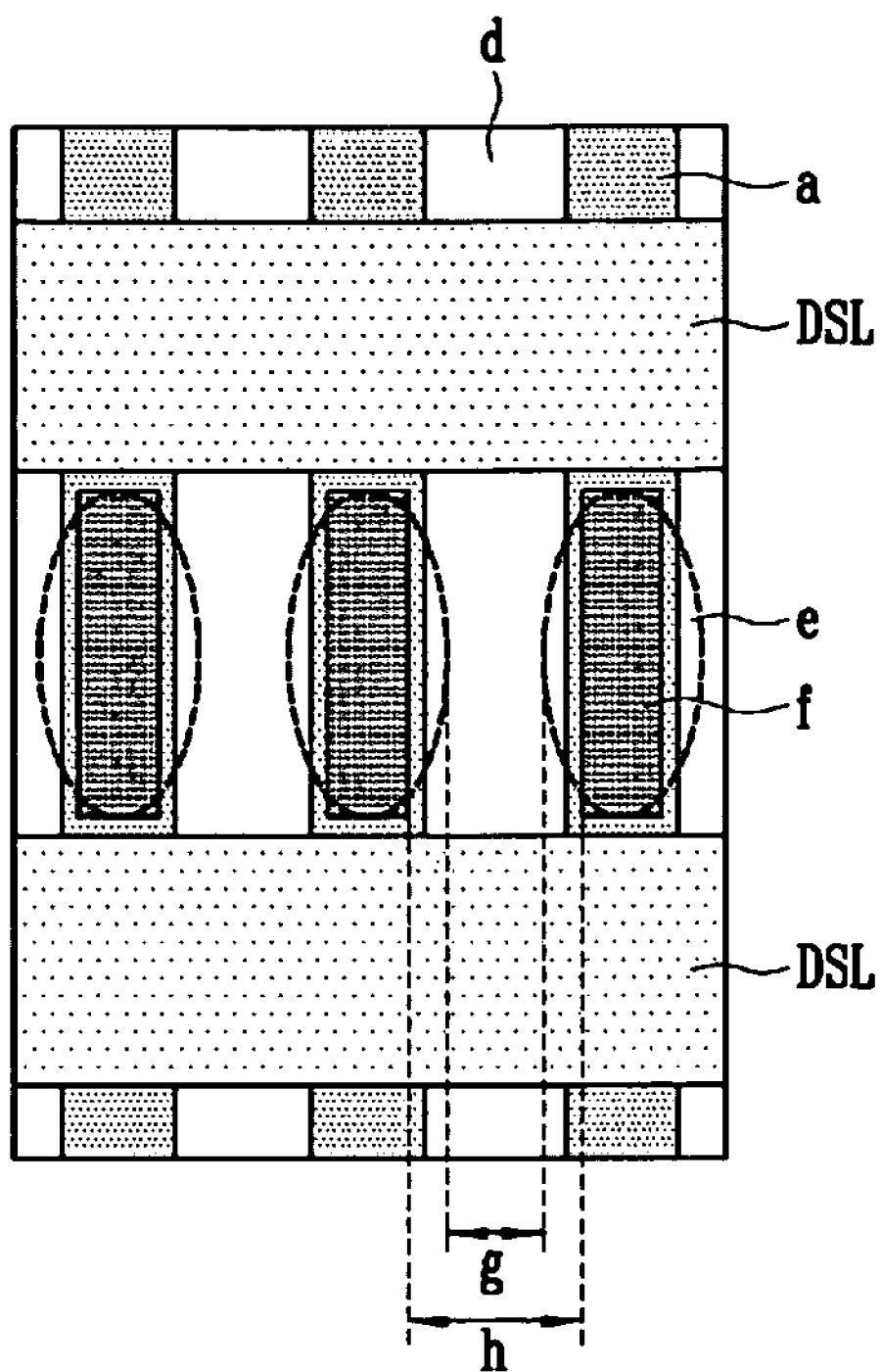
FIG. 3 is a layout diagram shown to compare a square type drain contact according to the invention and an existing circular drain contact.

FIG. 3 is a layout diagram shown to compare the square type drain contact according to the invention and an existing circular drain contact. There is shown in FIG. 3 a difference in the width between contacts.

Referring to FIG. 3, the active regions "a" in which a channel, source, and drain of a memory cell transistor will be formed are repeated in parallel to the field regions "d". A plurality of word lines which are spaced apart from each other at predetermined distances, are disposed on the active regions "a" to cross the active regions "a" and the field regions "d."

The drain select line DSL is disposed outside a first word line and the source select line (SSL) is disposed outside a last word line. Drain contacts "f" of a square shape are disposed on the active regions "a", respectively, between the drain select lines (DSL).

An existing drain contact "e" is circular and is narrow in width "g" between the contacts. However, the drain contact "f" of the invention is square and has a width "h" between the contacts, which is wider than the width "g" of the existing drain contact "e." Accordingly, when a contact is formed by gap filling the contact hole, a bridge occurring between contacts can be improved.

As described above, the invention has the following advantages.

The drain contact hole of the square type is formed to widen a width between contacts. It is therefore possible to improve a bridge occurring between the contacts.

Furthermore, global column failure by the bridge is prevented to improve the yield.

In addition, a bridge between the drain contact and the drain select line DSL due to an increase in the hole size of the photoresist pattern in the long-axis direction, which is generated when the hole size in the short-axis direction of the photoresist pattern is reduced in order to secure the width between the contacts, can be substantially prevented. It is thus possible to prevent the loss of the yield due to erase fail.

Although the foregoing description has been made with reference to various embodiments, changes and modifications may be made by those skilled in the art without departing from the spirit and scope of the invention.

What is claimed is:

1. A method of manufacturing a flash memory device, the method comprising the steps of:
   sequentially forming an etch-prevention layer, first and second interlayer insulating layers, and first, second, and third hard mask layers on a semiconductor substrate;
   etching the third hard mask layer to expose a portion of a region on the second hard mask layer;
   forming a photoresist pattern of a line shape on the entire surface such that the photoresist pattern is exposed to be narrower than the region through which the second hard mask layer is exposed, and then etching the second hard mask layer using the photoresist pattern as a mask;
   etching the first hard mask layer using the photoresist pattern as a mask, and then etching the second and first interlayer insulating layers using the remaining third and second hard mask layers as masks, thus forming a drain contact hole having a square shape; and
   etching the etch-prevention layer using the remaining second and first hard mask layers as masks, thus exposing a predetermined region of the semiconductor substrate and opening the drain contact hole.

2. The method of claim 1, comprising forming the second hard mask layer to a thickness of 200 Å to 800 Å and forming the third hard mask layer to a thickness of 300 Å to 1000 Å.

3. The method of claim 1, wherein in the case where the first hard mask layer is formed using silicon nitride series, forming the second hard mask layer using silicon oxide series and forming the third hard mask layer using polysilicon series or silicon nitride series.

4. The method of claim 1, wherein in the case where the first hard mask layer is formed using a stable hard mask series, forming the second hard mask layer using SiOxNy series and forming the third hard mask layer using polysilicon series.

5. The method of claim 1, comprising selecting regions through which a portion of a top surface of the third hard mask layer is exposed as a function of a space between drain select lines (DSL) and overlay margin of an exposure apparatus.

* * * * *